(12) United States Patent
Han

(10) Patent No.: US 7,368,749 B2
(45) Date of Patent: May 6, 2008

(54) METHOD OF DETECTING MISALIGNMENT OF ION IMPLANTATION AREA

(75) Inventor: Jae Won Han, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 39 days.

(21) Appl. No.: 11/523,961

(22) Filed: Sep. 19, 2006

(65) Prior Publication Data

US 2007/0026546 A1  Feb. 1, 2007

Related U.S. Application Data

(63) Continuation of application No. 10/923,996, filed on Aug. 23, 2004, now Pat. No. 7,122,388.

(30) Foreign Application Priority Data

Aug. 22, 2003  (KR)  ............ 10-2003-0058127

(51) Int. Cl.
 *H01L 23/58*  (2006.01)
 *H01L 23/544*  (2006.01)
 *H01L 29/10*  (2006.01)
(52) U.S. Cl. ............ 257/48; 257/797; 257/E23.001
(58) Field of Classification Search ............ 257/48, 257/797, E23.001
 See application file for complete search history.

(56) References Cited

U.S. PATENT DOCUMENTS 5,082,792 A  1/1992  Pasch et al.
5,256,577 A  10/1993  Pluntke et al.
5,434,089 A  7/1995  Barthez
5,956,566 A  9/1999  Lin et al.

(Continued)

OTHER PUBLICATIONS

Tenko Echigoya; Method for Detection of Positioning of Mask; Patent Abstracts of Japan; Publication No. 2003-059818; Publication Date: Feb. 28, 2003.
Akira Imai and Makoto Yoshida; Preparation of Pattern Data, and Production of Solid Element; Patent Abstracts of Japan; Publication No. 2000-292905; Publication Date: Oct. 20, 2000.
Hisao Takeda; Manufacture of Semiconductor Integrated Circuit Device; Patent Abstracts of Japan; Publication No. 06-267878; Publication Date: Sep. 22, 1994.

*Primary Examiner*—W. David Coleman
(74) *Attorney, Agent, or Firm*—Andrew D. Fortney

(57) ABSTRACT

A method of detecting misalignment of ion implantation areas comprises forming at least one standard pattern consisting of a first area and a second area for use in measuring resistance, implanting first and second conduction type impurity ions into the first and second areas, respectively, and measuring a resistance of the standard pattern. The method also includes forming a misalignment inspection pattern consisting of a first area and a second area on a predetermined area within a semiconductor substrate, implanting first and second conduction type impurity ions into the misalignment inspection pattern and active regions on the semiconductor substrate, respectively, and measuring a resistance of the misalignment inspection pattern. The method concludes by comparing the resistance of the standard pattern with the resistance of the misalignment inspection pattern.

20 Claims, 9 Drawing Sheets

U.S. PATENT DOCUMENTS

| | | |
|---|---|---|
| 6,072,192 A | 6/2000 | Fulford, Jr. et al. |
| 6,232,619 B1 | 5/2001 | Chen et al. |
| 6,620,526 B1 | 9/2003 | Tseng |
| 6,636,313 B2 | 10/2003 | Chen et al. |
| 6,657,203 B2 | 12/2003 | Koike |
| 6,713,883 B1 | 3/2004 | Hong et al. |
| 6,828,647 B2 | 12/2004 | Schafbauer et al. |
| 2002/0190252 A1 | 12/2002 | Adams et al. | p-type ions n-type ions

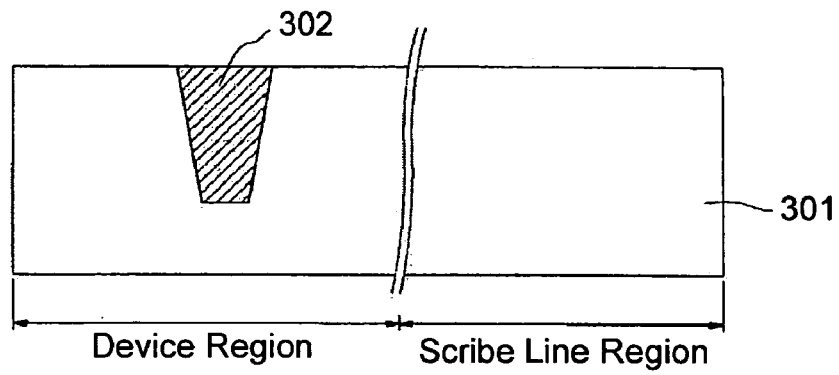
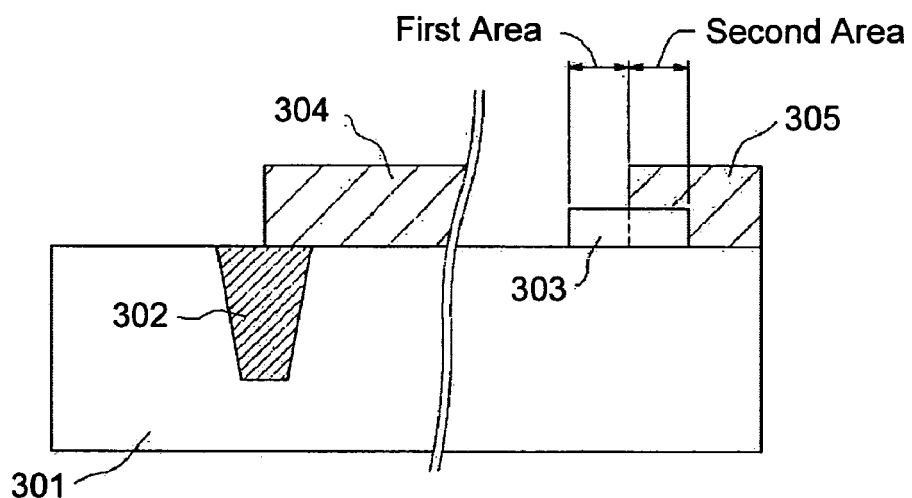
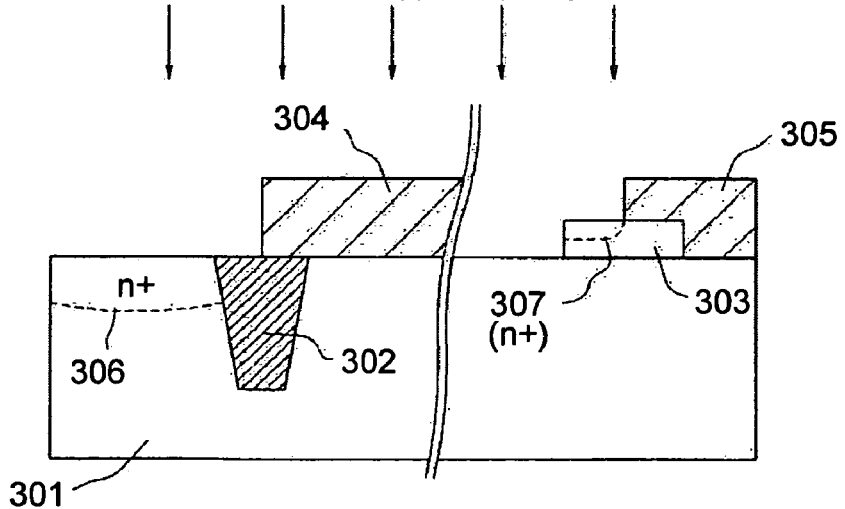

METHOD OF DETECTING MISALIGNMENT OF ION IMPLANTATION AREA

RELATED APPLICATIONS

The present application is a continuation of application Ser. No. 10/923,996,filed Aug. 23, 2004, now U.S. Pat. No. 7,122,388.

BACKGROUND OF THE INVENTION

1. Field of the Invention

The present disclosure relates to a method of detecting the misalignment of ion implantation areas of a semiconductor device and, more particularly, to a method of determining the misalignment of ion implantation areas immediately after an ion implantation process is completed.

2. Background of the Related Art

A complementary metal oxide semiconductor (hereinafter referred to as "CMOS") device comprises an N-MOS transistor and a P-MOS transistor which are formed within the same semiconductor substrate. Either N-MOS transistor or P-MOS transistor must be formed on an impurity region which has a different conduction type from that of substrate in order to separate electrically the N-MOS transistor from the P-MOS transistor on the semiconductor substrate. Particularly, the impurity region is called a well.

The well is generally created through a dopant ion implantation process, a lengthy thermal treatment process at a high temperature, and a diffusion process to diffuse the implanted dopant to an appropriate depth. This well is particularly known as a diffusion well. In addition to the diffusion well, various well structures have been developed to simplify a well formation process and to improve well functions. For example, a retrograde well is made by performing a high-energy ion implantation process to locate dopants at an appropriate depth after a device isolation structure is formed on a silicon substrate.

In making those well structures, it is very important to implant exactly n-type and p-type dopants into predetermined places within a silicon substrate and to align precisely n-type and p-type wells. If in fabricating a CMOS device the n-type and p-type wells are misaligned on the silicon substrate, devices such as transistors and capacitors, which are formed on the silicon substrate based on the p-type and n-type wells, may not properly function due to several problems such as leakage current.

A conventional well formation process is described to illustrate examples of misalignment of ion implantation areas. FIGS. 1a through 1c show, in cross-sectional views, a known process of forming n-type and p-type wells.

Referring to FIG. 1a, first, device isolation structures 102 are formed on a p-type semiconductor substrate 101 by a local oxidation of silicon (hereinafter referred to as "LOCOS") or a shallow trench isolation (hereinafter referred to as "STI") process so as to define active regions and field regions of a semiconductor device. A first ion implant mask 103 is then formed over the semiconductor substrate 101 by using photoresist. The first ion implant mask 103 exposes the some active regions of the semiconductor substrate on which a p-type well will be formed.

Referring to FIG. 1b, a p-type ion implantation process is performed for the semiconductor substrate 101, thereby forming a p-type ion implant layer 104 with a predetermined depth on the silicon substrate.

Referring to FIG. 1c, the first ion implant mask 103 is removed. Next, a photoresist layer is deposited over the semiconductor substrate 101 and a second ion implant mask 105 is patterned through exposure and development processes. The second ion implant mask 105 exposes other active regions on which an n-type well will be formed. An n-type ion implantation process is then performed for the semiconductor substrate 101, thereby forming an n-type ion implant layer 106 with a predetermined depth on the semiconductor substrate.

A thermal treatment process is then performed for the resulting substrate having n-type and p-type ion implant layers so that the ions in the n-type and p-type ion implant layers are diffused into the semiconductor substrate to complete n-type and p-type wells.

In the conventional well formation process, to form n-type and p-type wells ion implant masks are required. Each ion implant mask must be exactly positioned over the predetermined region of either an n-type or a p-type well. If the ion implant mask is misaligned, n-type or p-type impurity ions may not be implanted into the predetermined region.

Such misalignment may occur during an ion implantation process to define source/drain regions. For example, a device isolation structure is formed on a semiconductor substrate to define an active region. A gate electrode pattern is then formed on a predetermined position within the active region. And an n-type or p-type ion implantation process is carried out over the semiconductor substrate having the gate electrode pattern. Here, the ions implanted into a source/drain region within a first active region may have a different conduction type from the ions implanted into a source/drain region within a second active region adjacent to the first active region. For example, the ions implanted into a source/drain region within the first active region may be first conduction type impurity ions and, on the other hand, the ions implanted into a source/drain region within the second active region adjacent to the first active region may be second conduction type impurity ions. To form source/drain regions by implanting selectively the first and second conduction type ions into a plurality of active regions divided by device isolation structures, predetermined ion implant masks are required. Accordingly, misalignment may occur during ion implantation processes as stated in the above well formation process.

The misalignment in making source/drain regions is described in more detail referring to FIGS. 2a through 2i.

Referring to FIG. 2a, device isolation structures 202 are formed on a semiconductor substrate 201 to define a plurality of active regions. Next, n-type and p-type impurity ions are selectively implanted to form at least one source/drain region within each active region. Here, in order to implant specific conduction type ions only into a predetermined region, an ion implant mask with an appropriate pattern must be used so that regions in which opposite conduction type ions will be implanted can be protected. FIG. 2a illustrates, in a cross-sectional view, an ion implant configuration without misalignment due to correct disposition of the ion implant mask.

FIG. 2b illustrates, in a cross-sectional view, an example of a misaligned ion implant configuration. In FIG. 2b, each ion implant mask to implant n-type and p-type ions leaned to the right from a normal location before ion implantation processes were performed. In this case, if the semiconductor substrate is a p-type, there is no problem. However, if the semiconductor substrate is an n-type, leakage current may occur.

FIG. 2c shows, in a cross-sectional view, another example of a misaligned ion implant configuration. In FIG. 2c, an n-type ion implant mask leaned to the right and a p-type implant mask leaned to the left before ion implantation processes were performed. Both n-type impurities and p-type impurities were implanted into some areas on both sides of the device isolation area. In this case, if the silicon substrate is an n-type, leakage current occurs. If the silicon substrate is a p-type, a little leakage current may occur.

FIG. 2d illustrates, in a cross-sectional view, a third example of a misaligned ion implant configuration. In FIG. 2d, an n-type ion implant mask leaned to the left and a p-type ion implant mask leaned to the right before ion implantation processes were performed. In this case, leakage current will necessarily occur regardless of the conduction type of the silicon substrate.

FIGS. 2e through 2i also show, in cross-sectional views, other examples of misaligned ion implant configurations that may be occurred during the source/drain region formation. The misalignments illustrated in FIGS. 2a through 2i, may also appear during the well formation process.

In fabricating a CMOS device, the processes for forming wells and source/drain regions are carried out relatively at early stages during semiconductor fabrication. Therefore, if defects occur during the well or source/drain region formation and the later processes are performed without detection of the defects, the resulting devices will be defective whether the later processes are done with or without defects.

Semiconductor manufacturing generally comprises a fabrication process, an assembly process, and a test process. So, the defects of a semiconductor device with misaligned wells or source/drain regions are detected during the final test for the semiconductor device. As a result, to perform later processes and tests for the semiconductor device with defects due to misalignment of ion implantation areas may be a waste of time and increase production costs.

SUMMARY OF THE INVENTION

Accordingly, the present invention is directed to a method of detecting misalignment of ion implantation areas that substantially obviates one or more problems due to limitations and disadvantages of the related art.

An object of the present invention is to provide a method of detecting whether misalignment of ion implantation areas has occurred, immediately after completion of an ion implantation process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve this object and other advantages and in accordance with the purpose of the invention, as embodied and broadly described herein, the present invention provides a method of detecting misalignment of ion implantation areas, comprising forming a misalignment inspection pattern on a semiconductor substrate, wherein the misalignment inspection pattern have a first area and a second area, implanting first and second conduction type impurity ions into the misalignment inspection pattern and active regions on the semiconductor substrate, respectively, measuring a resistance of the misalignment inspection pattern, and detecting misalignment of ion implantation areas through comparing the resistance of the misalignment pattern with a reference resistance, wherein the reference resistance is made by measuring the resistance of the misalignment pattern in various misalignment case of the ion implantation areas.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 3a through 3e illustrate, in cross-sectional views, steps of a well formation process to describe a method of detecting misalignment of ion implantation areas according to the present invention.

DETAILED DESCRIPTION OF THE PREFERRED EMBODIMENT

Figure 1A:
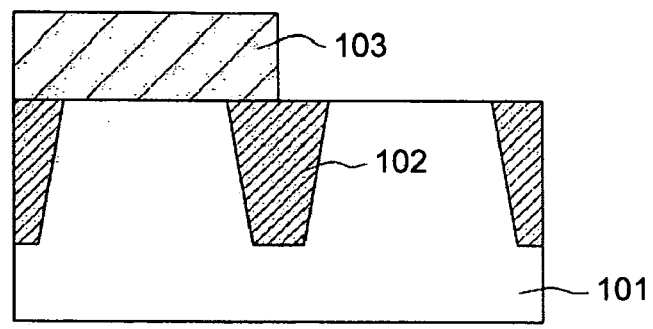
FIGS. 1a through 1c illustrate, in cross-sectional views, a known process of forming n-type and p-type wells.
Figure 1B:
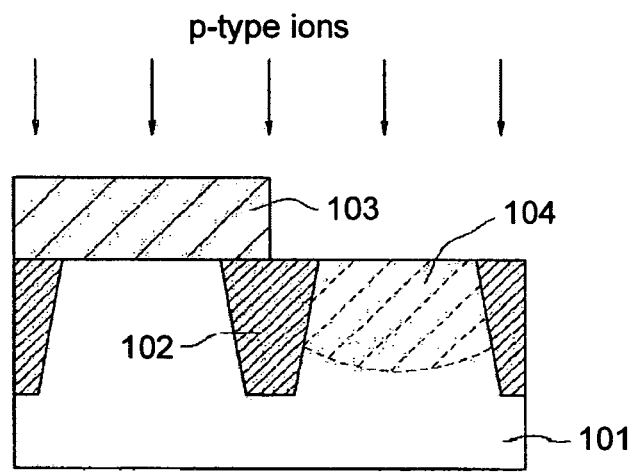
Figure 1C:
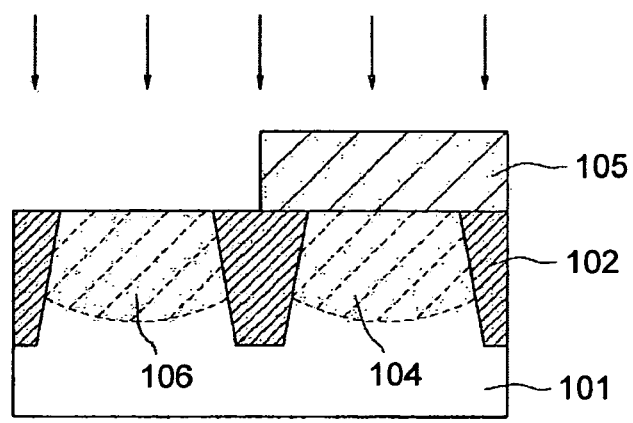
Figure 2A:
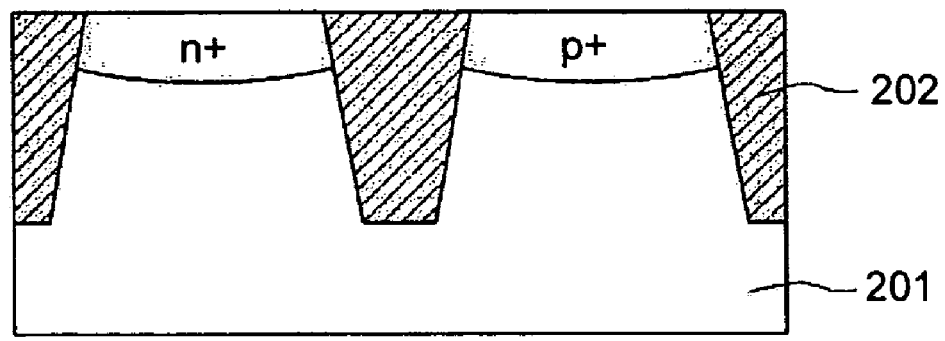
FIGS. 2a through 2i show, in cross-sectional views, examples of ion implantation configurations that may be occurred during a source/drain formation process.
Figure 2B:
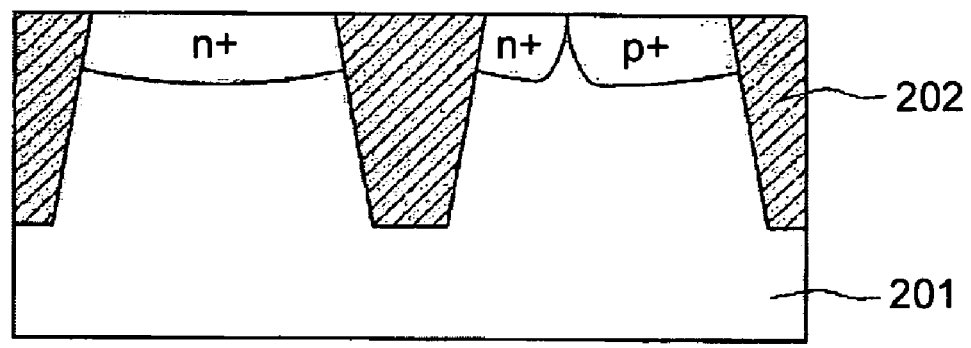
Figure 2C:
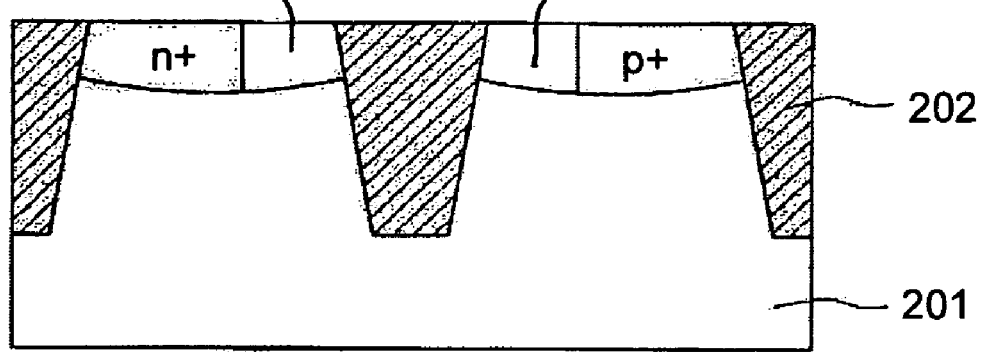
Figure 2D:
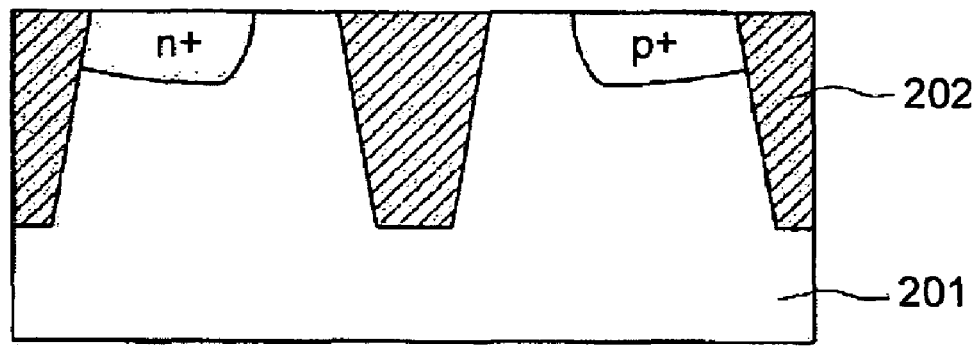
Figure 2E:
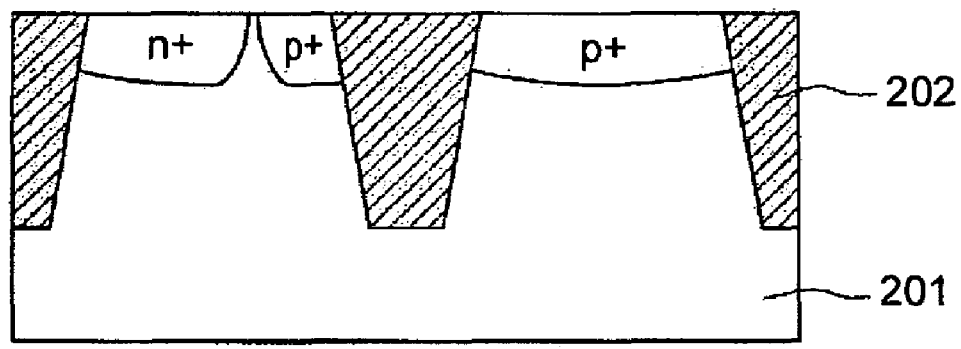
Figure 2F:
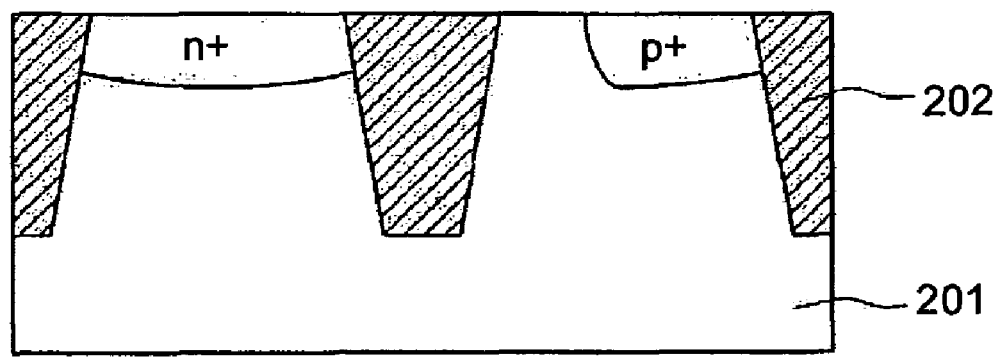
Figure 2G:
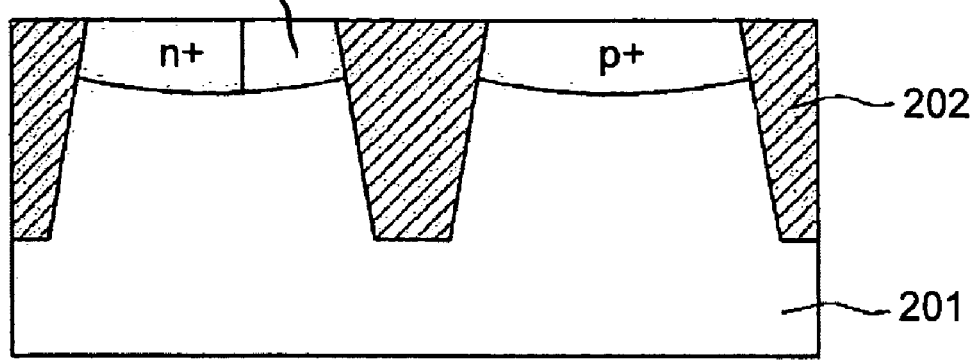
Figure 2H:
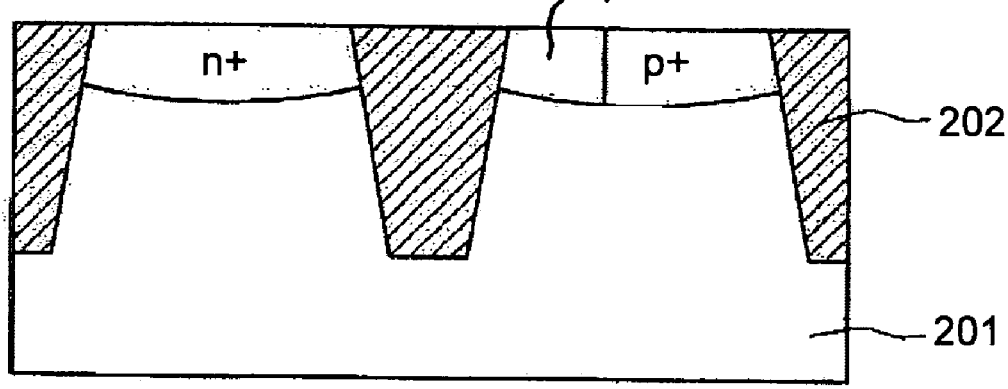
Figure 2I:
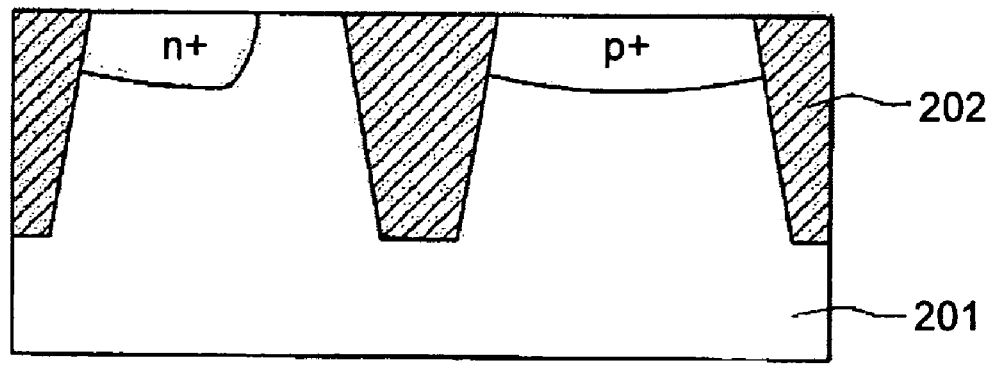

In fabricating semiconductor devices, each unit process is not performed only for one chip. Rather, the semiconductor devices are manufactured by a mass-production system that the same process is applied to a large amount of chips in a lump. The present invention takes advantage of features of such a process production.

In more detail, there are a plurality of unit chip regions on a single crystal silicon substrate. These unit chip regions are separated by scribe lines which are crossed vertically and horizontally at prescribed intervals on the silicon substrate. The scribe lines are cutting areas to saw off each unit chip on the single crystal silicon substrate after completion of the fabrication process.

As mentioned above, there are a plurality of unit chips on a semiconductor substrate and each process for fabricating a semiconductor device is simultaneously applied to all the unit chips. For example, the steps of depositing and patterning a material layer to form a predetermined pattern on a semiconductor substrate are carried out for all the unit chips on the semiconductor substrate at the same time. An ion implantation process is simultaneously applied to all the unit chips on the semiconductor substrate as well.

On the basis of such a premise, an ion implantation process is described in more detail. The ion implantation is carried out at various process stages, for example, well and source/drain formation processes, during semiconductor device fabrication. The ion implantation is fundamentally associated with an electric current mechanism on a semiconductor. To apply an electric current to a semiconductor, some impurities have to be implanted into a substrate. The semiconductor substrate is classified as an n-type or a p-type according to the type of impurities implanted. Therefore, the ion implantation is classified as an n-type impurity ion implantation or a p-type impurity ion implantation.

On the other hand, a unit chip comprises a plurality of active regions on which elements such as transistors and capacitors are formed, and a plurality of field regions by which the active regions are divided. Practically, the semiconductor device fabrication processes are carried out only for the active regions. Precisely speaking, the enbloc process to a plurality of unit chips is performed for the plurality of active regions within each unit chip.

For example, in case of an ion implantation process, either n-type or p-type impurity ion implantation is selectively applied according to characteristics of device to be formed on each active region. Thus, the active regions are divided into n-type impurity implant areas and p-type impurity implant areas. The n-type impurity ions and p-type impurities ions are selectively implanted into each active region.

To implant selectively the n-type impurity ions and p-type impurity ions, for example, while an n-type impurity ion implantation is performed, the p-type impurity ion areas should be protected from the n-type ion implantation by an appropriate protection layer. A photoresist pattern is generally used as the protection layer.

The photoresist layer is deposited over the semiconductor substrate by a coating equipment and a necessary photoresist pattern is then formed through a known photolithography process. The photolithography process comprises an exposure process that subjects the photoresist layer to light or other radiant energy, a development process that develops the exposed photoresist layer, and a removing process that removes exposed or unexposed areas of the photoresist layer to make the necessary photoresist pattern. In the exposure process, a reticle is used to expose some parts of the photoresist layer to light. The reticle is a very flat glass plate that contains the patterns to be reproduced on a wafer.

Reference will now be made in detail to the preferred embodiments of the present invention, examples of which are illustrated in the accompanying drawings.

Referring to FIG. 3a, a semiconductor substrate 301 on which a plurality of unit chip regions are defined by scribe line regions is provided. The semiconductor substrate 301 may be a single crystal silicon substrate with a first conduction type. The first conduction type may be an n-type or a p-type. At least one device isolation structure 302 is formed on the first conduction type semiconductor substrate 301 by either a LOCOS or an STI process. Thus, a plurality of active regions are defined within the device regions divided by the scribe line regions.

Referring to FIG. 3b, a photoresist layer is deposited over the semiconductor substrate to make an ion implant mask to implant selectively first or second conduction type impurity ions. In addition, a misalignment inspection pattern 303 with a predetermined shape and length is formed within a predetermined area on the semiconductor substrate, such as a scribe line region. The misalignment inspection pattern 303 is made of the same material with the semiconductor substrate 301 before the photoresist is deposited over the semiconductor substrate. In more detail, the misalignment inspection pattern 303 may be formed before the formation of the device isolation structure or between the deposition of the photoresist layer and the formation of the device isolation structure. Therefore, the misalignment inspection pattern 303 is also coated with the photoresist layer.

Next, a photolithography process is performed for the photoresist layer to form photoresist patterns as ion implant masks. Through the photolithography process, a first ion implant mask 304 is formed over the device region and a third ion implant mask 305 is formed over the misalignment inspection pattern 303 on the scribe line region. The first ion implant mask 304 exposes a first active region on which a first conduction type well is formed. The third ion implant mask 305 exposes a predetermined area of the misalignment inspection pattern 303, i.e., a first area. The ion implant masks 304 and 305 are simultaneously formed in the same shape within a plurality of active regions and a plurality of unit chips by using the reticle.

Referring to FIG. 3c, a first conduction type ion implantation process is performed by using the first and third ion implant masks 304 and 305. First conduction type impurity ions, for example, n-type impurity ions, are implanted into the semiconductor substrate having the scribe line regions. Accordingly, a first ion implantation area 306 with first conduction type impurity ions is formed on the device region exposed by the first ion implant mask 304, i.e., the first active region. In addition, a third ion implantation area 307 with first conduction type impurity ions is formed on the first area of the misalignment inspection pattern 303. The first and third ion implant masks 304 and 305 are then removed by using an ashing process.

Figure 3D:
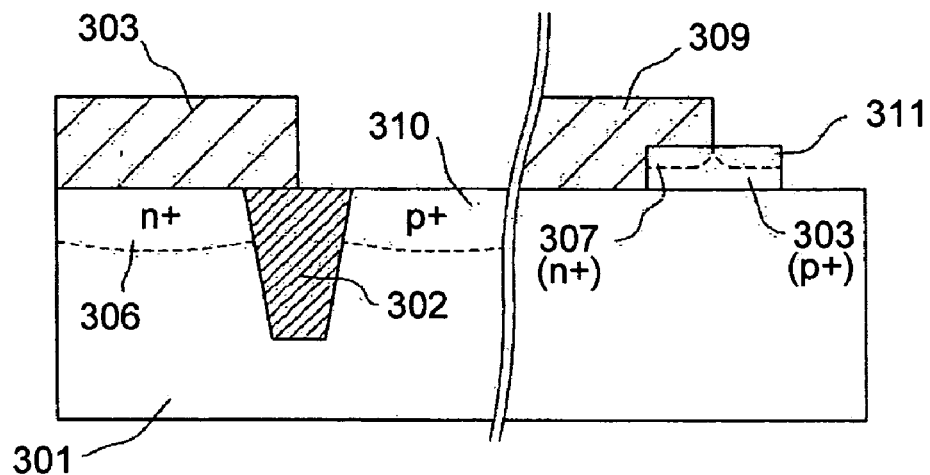

Referring to FIG. 3d, another photoresist layer is deposited over the semiconductor substrate 301 to make other ion implant masks to implant second conduction type impurity ions. A photolithography process is performed for the photoresist layer to make photoresist patterns as ion implant masks. Here, a second ion implant mask 308 and a fourth ion implant mask 309 are formed. The second ion implant mask 308 exposes a second active region of the device region on which a second conduction type well is formed. The fourth ion implant mask 309 exposes a second area of the misalignment inspection pattern 303 on which second conduction type impurity ions are implanted.

Next, a second conduction type impurity ion implantation process is performed for the semiconductor substrate by using the second and fourth ion implant masks 308 and 309. As a result, a second ion implantation area 310 is formed on the second active region, and a fourth ion implantation area 311 is formed on the second area of the misalignment inspection pattern 303.

Figure 3E:
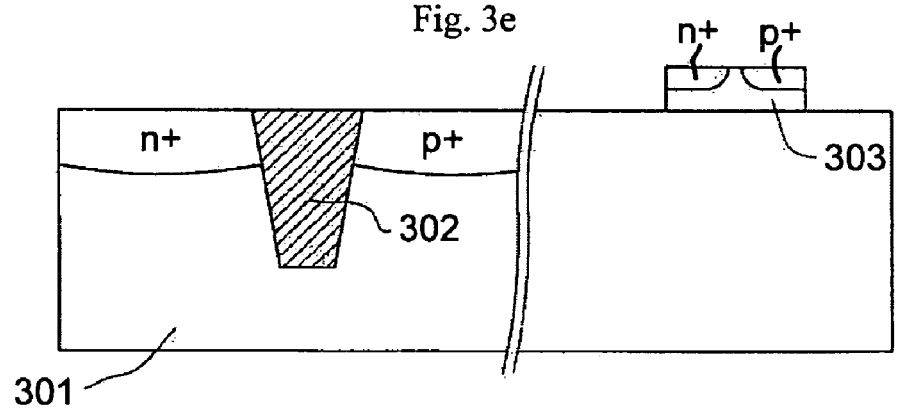

Referring to FIG. 3e, the second and fourth ion implant masks are removed by using an ashing process. An annealing process is then performed for the resulting structure to diffuse the implanted first and second type impurity ions into each region. As a result, a first conduction type well and a second conduction type well are formed on the device region. Here, the first and second conduction type impurity ions implanted into the misalignment inspection pattern 303 are also diffused at the sane time.

According to the above-mentioned process steps, the ion implantation is completed. Now, whether or not the first and second conduction type wells have correctly been aligned has to be inspected.

The present invention forms the misalignment inspection pattern on the scribe line region and performs the same ion implantation process for the misalignment inspection pattern and the device region at the same time in order to determine whether or not the first and second conduction type wells have correctly been aligned.

On the other hand, in a semiconductor device fabrication process, particularly, a photolithography process, an exposure using a reticle is essential to make a necessary photoresist pattern. The pattern on the reticle comprises the same repeated images and, therefore, making a photoresist pattern over the semiconductor substrate is influenced by a location and an alignment of the reticle. If the reticle leans toward a particular direction from a correct location and the photolithography process is performed, the photoresist pattern formed on the semiconductor substrate is also misaligned according to the degree of misalignment of the reticle. This is one of the enbloc process characteristics of semiconductor device fabrication.

The present invention takes advantage of such an enbloc process characteristic of semiconductor device fabrication. In more detail, the present invention stands on a basis of an assumption that if first and second conduction type wells in a device region were misaligned, impurity ion regions on a misalignment inspection pattern within a scribe line region must have been misaligned.

To describe an embodiment of the present invention, the above-mentioned eight examples of misalignment are considered in more detail. The eight misalignment examples represent possible deviations of an ion implantation area from a predetermined region due to the misalignment of ion implant masks. The eight misalignments and one correct alignment are a number of cases which can occur during the ion implantation process. In these nine cases, each ion implant configuration represents a characteristic resistance according to the type of ion implanted and the ion implantation area formed. The present invention takes advantage of the different resistance between the nine misalignment cases.

Prior to performance of ion implantation process for the misalignment inspection pattern and the active regions of the semiconductor substrate, the necessary basic information has to be established to determine whether or not an ion implantation area is misaligned. Here, the basic information preferably means the resistance values in the nine cases.

Figure 4A:
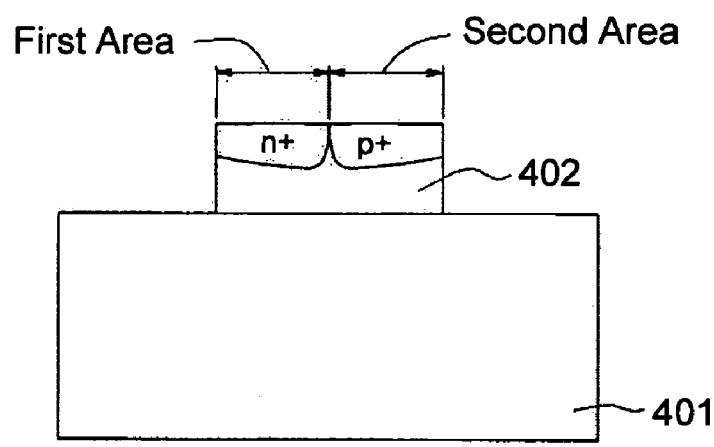
FIGS. 4a through 4i show, in cross-sectional views, standard patterns for use in measuring various types of resistance, which are employed to detect misalignment of ion implantation areas.

To obtain the resistance values for the nine cases, the following method is conducted. Referring to FIG. 4a, a standard pattern 402 with a predetermined configuration is formed on a semiconductor substrate 401. The standard pattern 402 is made of the same material with the semiconductor substrate 401, preferably, single crystal silicon or polysilicon. To form the standard pattern 402, a single crystal silicon or polysilicon layer is deposited over the semiconductor substrate by means of chemical vapor deposition or physical vapor deposition. Some part of the deposited silicon layer is then selectively removed to form the standard pattern 402. The standard pattern 402 has the same configuration with the misalignment inspection pattern and is made of the same material with the misalignment inspection pattern. The standard pattern is divided into a first area and a second area like the misalignment inspection pattern. Next, ion implantation processes are carried out for the standard pattern 402. If ion implant masks are correctly aligned, first conduction type impurity ions (for example, n-type ions) are implanted into the first area and second conduction type impurity ions (for example, p-type ions) are implanted into the second area.

FIGS. 4a through 4i illustrate, in cross-sectional views, the standard patterns having various ion implant configurations.

Referring to FIG. 4a, n-type ions are implanted into the first area of the standard pattern 402. P-type ions are implanted into the second area of the standard pattern 402.

Figure 4B:
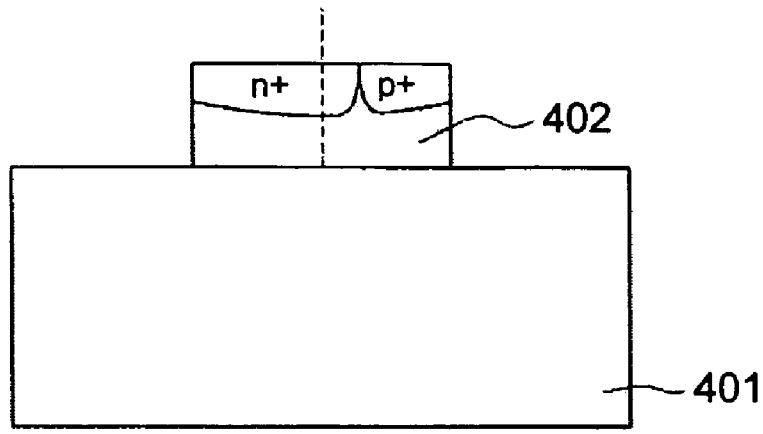

Referring to FIG. 4b, n-type ions are implanted into the whole first area and some part of the second area. P-type ions are implanted into the rest part of the second area.

Figure 4C:
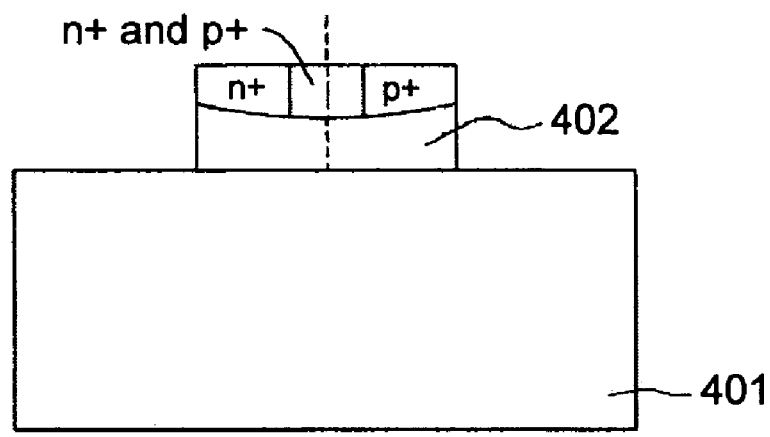

Referring to FIG. 4c, n-type ions are implanted into the whole first area and some part of the second area. P-type ions are implanted into the whole second area and some part of the first area.

Figure 4D:
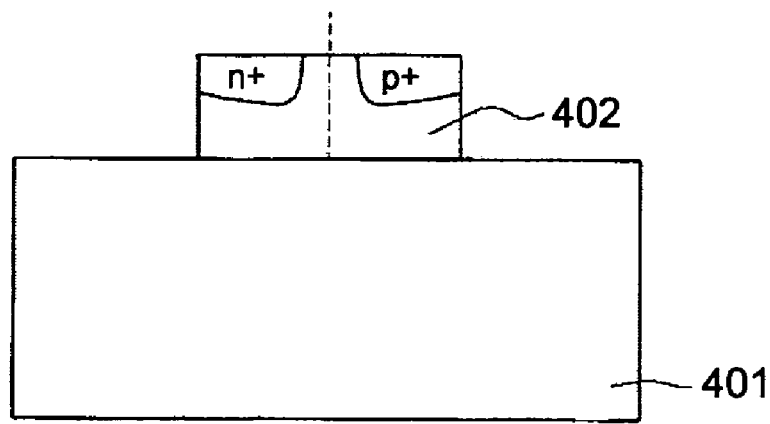

Referring to FIG. 4d, n-type ions are implanted into some part of the first area. P-type ions are implanted into some part of the second area.

Figure 4E:
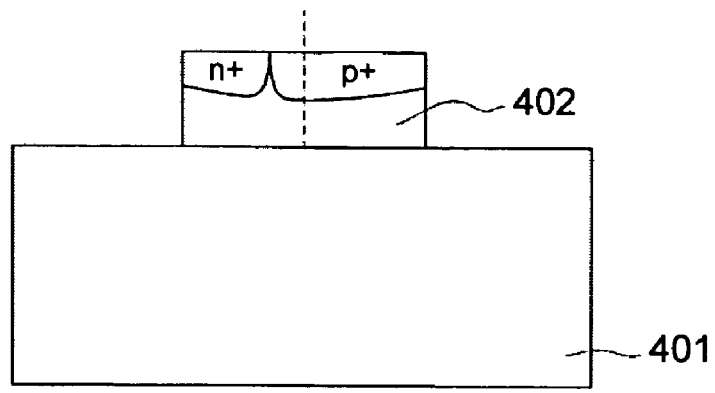

Referring to FIG. 4e, n-type ions are implanted into some part of the first area. P-type ions are implanted into the second area and the rest part of the first area.

Figure 4F:
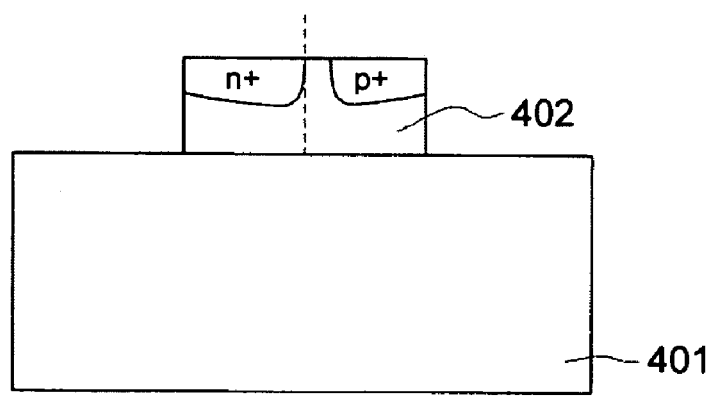

Referring to FIG. 4f, n-type ions are implanted into the whole first area. P-type ions are implanted into some part of the second area.

Figure 4G:
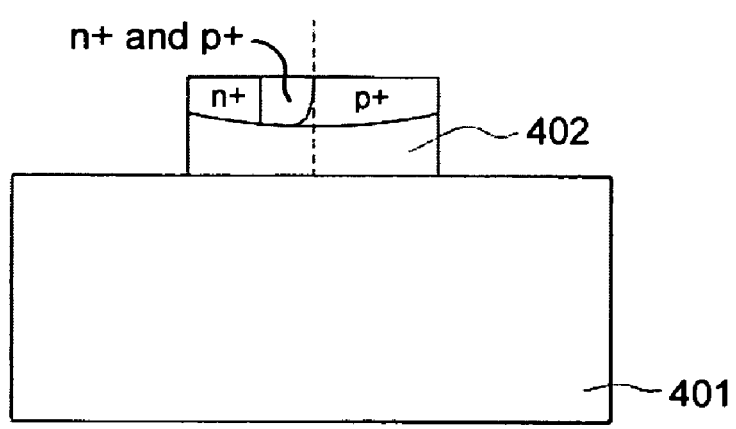

Referring to FIG. 4g, n-type ions are implanted into the whole first area. P-type ions are implanted into the whole second area and some part of the first area.

Figure 4H:
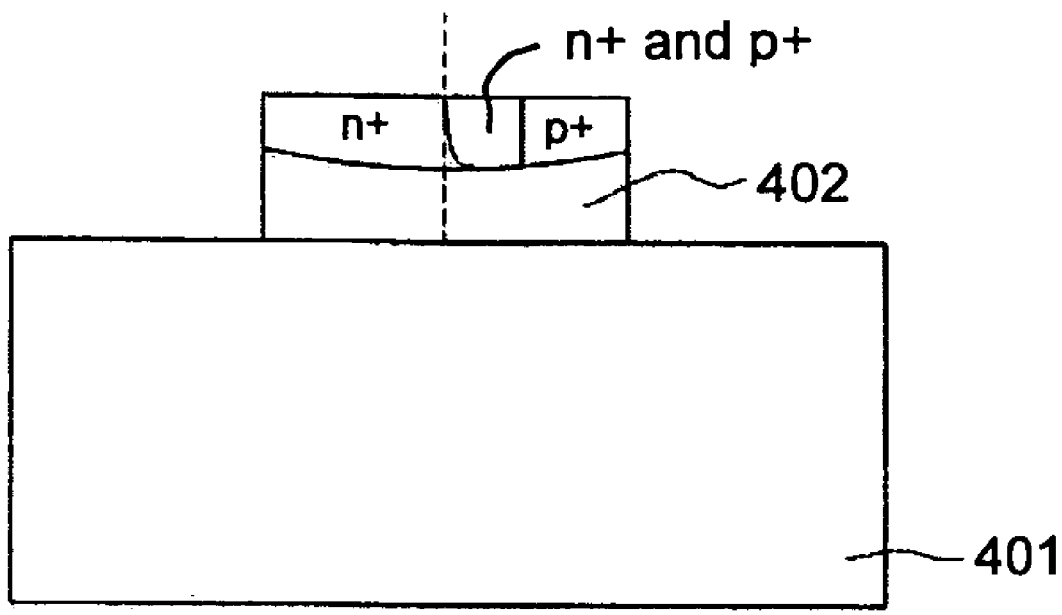

Referring to FIG. 4h, n-type ions are implanted into the whole first area and some part of the second area. P-type ions are implanted into the whole second area.

Figure 4I:
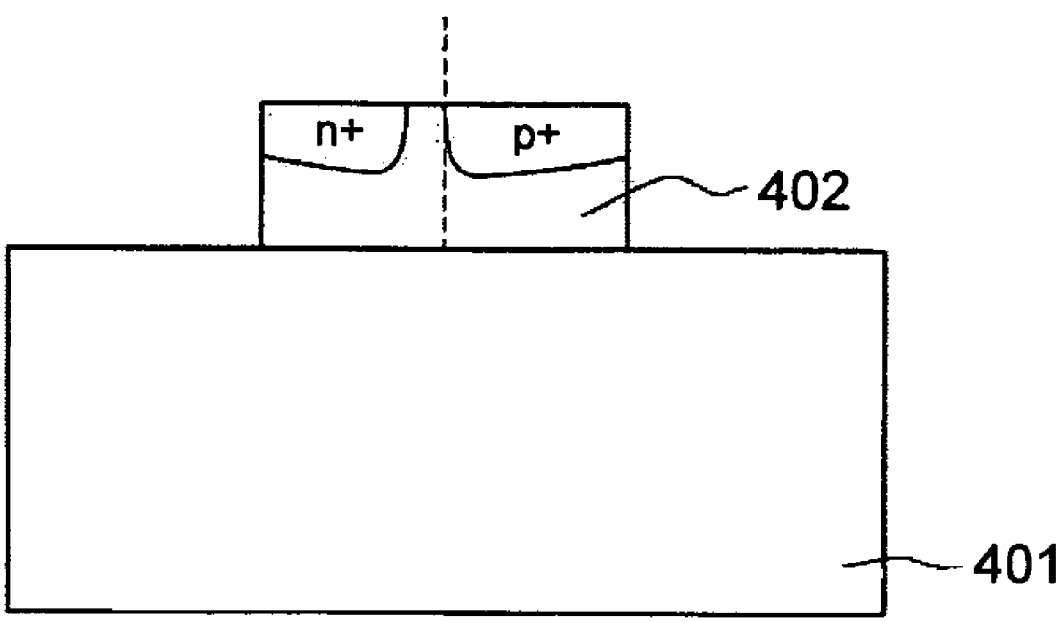

Referring to FIG. 4i, n-type ions are implanted into some part of the first area. P-type ions are implanted into the whole second area.

Subsequently, an annealing process is performed for each standard pattern with the ion implantation areas. Resistance of each standard pattern is then measured.

More cases of misalignment may be made although the present invention provides eight cases of misalignment of ion implant masks. For example, in each case of the presented misalignments, more various misalignment configurations can be conceived by diversifying deviation of the ion implant mask.

By measuring the resistance values for the nine cases, it is possible to detect whether the ion implantation area is misaligned or not. In addition, if an ion implantation area was misaligned, the degree and direction of deviation of the ion implant mask can be calculated. In detail, resistance of a misalignment inspection pattern on a scribe line region is measured and the measured resistance is compared to the resistances for the nine cases of standard patterns.

The method of detecting misalignment of ion implantation areas can be applied to a source/drain formation process as well as a well formation process. As mentioned above, there are a plurality of unit chips on a semiconductor substrate and there are a plurality of active regions within each unit chip. Particular conduction type impurity ions are implanted into the active regions to form source/drain regions. The active regions are classified as a first active region in which first conduction type impurity ions are implanted, and a second active region in which second conduction type impurity ions are implanted. The particular conduction type ions are implanted by using an appropriate ion implant mask. Therefore, misalignment of ion implantation areas may occur due to misalignment of the ion implant masks like the well formation process. Such misalignment can also be detected through the misalignment detection method according to present invention.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A Semiconductor Device for detecting misalignment of ion implantation areas comprising:

at least one standard pattern for measuring resistance above a semiconductor substrate;

first and second areas formed in the standard pattern by implanting first and second conduction type impurity ions into the first and the second areas formed in the standard pattern;

a misalignment inspection pattern formed above the semiconductor substrate; and a first area and a second area formed in the misalignment inspection pattern by implanting first and second conduction type impurity ions into the misalignment inspection pattern and active regions on the semiconductor substrate, respectively.

2. The Semiconductor Device as defined by claim 1, wherein the center of the misalignment inspection pattern is a boundary between the first area and the second area in the misalignment inspection pattern.

3. The Semiconductor Device as defined by claim 1, wherein the misalignment inspection pattern of the ion implantation areas is implanted by the first conduction type impurity ions into the whole first area of the misalignment inspection pattern and implanted by the second conduction type impurity ions into the whole second area of the misalignment inspection pattern.

4. The Semiconductor Device as defined by claim 1, wherein the misalignment inspection pattern of the ion implantation areas is implanted by the first conduction type impurity ions into the whole first area and some part of the second area of the misalignment inspection pattern, and implanted by the second conduction type impurity ions into the rest part of the second area of the misalignment inspection pattern.

5. The Semiconductor Device as defined by claim 1, wherein the misalignment inspection pattern of the ion implantation areas is implanted by the first conduction type impurity ions into the whole first area and some part of the second area of the misalignment inspection pattern, and implanted by the second conduction type impurity ions into the whole second area and some part of the first area of the misalignment inspection pattern.

6. The Semiconductor Device as defined by claim 1, wherein the misalignment inspection pattern of the ion implantation areas is implanted by the first conduction type impurity ions into some part of the first area of the misalignment inspection pattern, and implanted by the second conduction type impurity ions into some part of the second area of the misalignment inspection pattern.

7. The Semiconductor Device as defined by claim 1, wherein the misalignment inspection pattern of the ion implantation areas is implanted by the first conduction type impurity ions into some part of the first area of the misalignment inspection pattern, and implanted by the second conduction type impurity ions into the rest part of the first area and the whole second area of the misalignment inspection pattern.

8. The Semiconductor Device as defined by claim 1, wherein the misalignment inspection pattern of the ion implantation areas is implanted by the first conduction type impurity ions into the whole first area of the misalignment inspection pattern, and implanted by the second conduction type impurity ions into some part of the second area of the misalignment inspection pattern.

9. The Semiconductor Device as defined by claim 1, wherein the misalignment inspection pattern of the ion implantation areas is implanted by the first conduction type impurity ions into the whole first area of the misalignment inspection pattern, and implanted by the second conduction type impurity ions into some part of the first area and the whole second area of the misalignment inspection pattern.

10. The Semiconductor Device as defined by claim 1, wherein the misalignment inspection pattern of the ion implantation areas is implanted by the first conduction type impurity ions into the whole first area and some part of the second area of the misalignment inspection pattern, and implanted by the second conduction type impurity ions into the whole second area of the misalignment inspection pattern.

11. The Semiconductor Device as defined by claim 1, wherein the misalignment inspection pattern of the ion implantation areas is implanted by the first conduction type impurity ions into some part of the first area of the misalignment inspection pattern, and implanted by the second conduction type impurity ions into the whole second area of the misalignment inspection pattern.

12. The Semiconductor Device as defined by claim 1, wherein the first conduction type impurity ions are an n-type if the second conduction type impurity ions are a p-type.

13. The Semiconductor Device as defined by claim 1, wherein the first conduction type impurity ions are a p-type if the second conduction impurity ions are an n-type.

14. The Semiconductor Device as defined by claim 1, wherein the active regions comprise a first active region in which the first conduction type impurity ions are implanted and a second active region in which the second conduction type impurity ions are implanted.

15. The Semiconductor Device as defined by claim 1, wherein the active regions implanted by impurity ions are for wells or source/drain regions.

16. The Semiconductor Device as defined by claim 1, wherein the misalignment inspection pattern is made of the same material with the semiconductor substrate.

17. The Semiconductor Device as defined by claim 1, wherein the misalignment inspection pattern is made of the same material with the standard pattern, and is made of the same shape of the standard pattern.

18. The Semiconductor Device as defined by claim 1, wherein the misalignment inspection pattern is formed on a scribe line region within the semiconductor substrate.

19. The Semiconductor Device as defined by claim 14, wherein the impurity ions implanted into the active regions and into the misalignment inspection pattern comprise
first conduction type impurity ions implanted into the first active region and into the first area of the misalignment inspection pattern; and
second conduction type impurity ions implanted into the second active region and the second area of the misalignment inspection pattern.

20. The Semiconductor Device as defined by claim 14, a division of the first active region and the second active region corresponds to a division of the first area and the second area formed in the misalignment inspection pattern.

* * * * *